United States Patent
Nagaraj et al.

(10) Patent No.: US 7,916,824 B2
(45) Date of Patent: Mar. 29, 2011

(54) LOOP BANDWIDTH ENHANCEMENT TECHNIQUE FOR A DIGITAL PLL AND A HF DIVIDER THAT ENABLES THIS TECHNIQUE

(75) Inventors: Krishnaswamy Nagaraj, Plano, TX (US); Karthik Subburaj, Bangalore (IN)

(73) Assignee: Texas Instruments Incorporated, Dallas, TX (US)

( * ) Notice: Subject to any disclaimer, the term of this patent is extended or adjusted under 35 U.S.C. 154(b) by 902 days.

(21) Appl. No.: 11/891,203

(22) Filed: Aug. 8, 2007

(65) Prior Publication Data

US 2008/0043893 A1    Feb. 21, 2008

Related U.S. Application Data

(60) Provisional application No. 60/822,881, filed on Aug. 18, 2006.

(51) Int. Cl.
*H03D 3/24* (2006.01)
(52) U.S. Cl. .......................................... 375/376
(58) Field of Classification Search ............ 375/215, 375/294, 327, 376; 342/103; 370/503; 327/141, 327/146, 147, 148, 149, 150, 156, 157, 158, 327/159; 455/180.3, 266
See application file for complete search history.

(56) References Cited

U.S. PATENT DOCUMENTS

| | | | |
|---|---|---|---|
| 4,963,839 A | 10/1990 | Stacey | |
| 5,452,325 A | 9/1995 | Brown et al. | |
| 5,825,254 A | 10/1998 | Lee | |
| 6,356,158 B1 * | 3/2002 | Lesea | 331/11 |
| 7,567,101 B2 * | 7/2009 | Yokozeki | 327/156 |
| 2003/0025539 A1* | 2/2003 | Fiscus | 327/158 |
| 2004/0202271 A1 | 10/2004 | Fahim | |
| 2004/0232960 A1 | 11/2004 | Albasini et al. | |
| 2005/0285685 A1 | 12/2005 | Frey | |
| 2006/0139194 A1 | 6/2006 | Hasegawa | |
| 2007/0297488 A1* | 12/2007 | Chang | 375/130 |

OTHER PUBLICATIONS

Vaucher et al., "A Family of Low-Power Truly Modular Programmable Dividers in Standard 0.35-μm CMOS Technology," IEEE Journal of Solid-State Circuits, vol. 35, No. 7, pp. 1039-1045, (Jul. 2000).

* cited by examiner

*Primary Examiner* — Sam K Ahn
(74) *Attorney, Agent, or Firm* — Ronald O. Neerings; Wade James Brady, III; Frederick J. Telecky, Jr.

(57) ABSTRACT

A method of operating a phase locked loop (FIG. 5) for a wireless receiver is disclosed. The method includes receiving a reference signal (503) having a first and a second plurality of cycles and receiving a feedback signal (512) having the first and the second plurality of cycles. The feedback signal is compared (504) to the reference signal. A plurality of phase errors is produced for each cycle of (UP, FIG. 10A) the first plurality of cycles in response to the step of comparing.

13 Claims, 6 Drawing Sheets

US 7,916,824 B2

LOOP BANDWIDTH ENHANCEMENT TECHNIQUE FOR A DIGITAL PLL AND A HF DIVIDER THAT ENABLES THIS TECHNIQUE

CROSS-REFERENCES TO RELATED APPLICATIONS

This application claims the benefit, under 35 U.S.C. §119 (e)(1), of U.S. Provisional Application No. 60/822,881 (TI-61884PS), filed Aug. 18, 2006, and incorporated herein by this reference.

BACKGROUND OF THE INVENTION

The present embodiments relate to wireless communications systems and, more particularly, to a high frequency programmable frequency divider for frequency modulated (FM) carrier generation for handheld wireless communication systems.

Wireless communications are prevalent in business, personal, and other applications, and as a result the technology for such communications continues to advance in various areas. One such advancement includes the use of spread spectrum communications, including that of code division multiple access (CDMA) which includes wideband code division multiple access (WCDMA) cellular communications. In CDMA communications, user equipment (UE) (e.g., a hand held cellular phone, personal digital assistant, or other) communicates with a base station, where typically the base station corresponds to a "cell." CDMA communications are by way of transmitting symbols from a transmitter to a receiver, and the symbols are modulated using a spreading code which consists of a series of binary pulses. The code runs at a higher rate than the symbol rate and determines the actual transmission bandwidth. In the current industry, each piece of CDMA signal transmitted according to this code is said to be a "chip," where each chip corresponds to an element in the CDMA code. Thus, the chip frequency defines the rate of the CDMA code. WCDMA includes alternative methods of data transfer, one being frequency division duplex (FDD) and another being time division duplex (TDD), where the uplink and downlink channels are asymmetric for FDD and symmetric for TDD.

The Global System for Mobile (GSM) communications is another common wireless standard. Most GSM systems use either 900 MHz or 1800 MHz bands. The 900 MHz band is divided into an 890-915 MHz uplink frequency band and a 935-960 MHz downlink frequency band. Each 25 MHz bandwidth is divided into 124 carrier frequency channels spaced 200 kHz apart. Each carrier frequency channel transmits and receives over eight time division multiple access (TDMA) time slots in each TDMA frame. TDMA communications are transmitted as a group of packets in a time period, where the time period is divided into time slots so that multiple receivers may access meaningful information during a different part of that time period. In other words, in a group of TDMA receivers, each receiver is designated a time slot in the time period, and that time slot repeats for each group of successive packets transmitted to the receiver. Accordingly, each receiver is able to identify the information intended for it by synchronizing to the group of packets and then deciphering the time slot corresponding to the given receiver. Given the preceding, CDMA transmissions are receiver-distinguished in response to codes, while TDMA transmissions are receiver-distinguished in response to time slots.

New standards for Digital Video Broadcast (DVB) standards are currently being developed to permit streaming video reception by portable user equipment. DVB typically uses carrier frequencies in the 470-800 MHz band. DVB packets or data streams are transmitted by Orthogonal Frequency Division Multiplex (OFDM) transmission with time slicing. With OFDM, multiple symbols are transmitted on multiple carriers that are spaced apart to provide orthogonality. An OFDM modulator typically takes data symbols into a serial-to-parallel converter, and the output of the serial-to-parallel converter is considered as frequency domain data symbols. The frequency domain tones at either edge of the band may be set to zero and are called guard tones. These guard tones allow the OFDM signal to fit into an appropriate spectral mask. Some of the frequency domain tones are set to values which will be known at the receiver, and these tones are termed pilot tones or symbols. These pilot symbols can be useful for channel estimation at the receiver. An inverse fast Fourier transform (IFFT) converts the frequency domain data symbols into a time domain waveform. The IFFT structure allows the frequency tones to be orthogonal. A cyclic prefix is formed by copying the tail samples from the time domain waveform and appending them to the front of the waveform. The time domain waveform with cyclic prefix is termed an OFDM symbol, and this OFDM symbol may be upconverted to an RF frequency and transmitted. An OFDM receiver may recover the timing and carrier frequency and then process the received samples through a fast Fourier transform (FFT). The cyclic prefix may be discarded and after the FFT, frequency domain information is recovered. The pilot symbols may be recovered to aid in channel estimation so that the data sent on the frequency tones can be recovered.

Present mobile communication systems are also designed to accommodate other services such as amplitude modulated (AM) and frequency modulated (FM) radio reception. FM receivers, in particular, require high frequency, low power frequency synthesizers to reproduce the FM carrier in a local oscillator (LO). An efficient low power frequency divider that may be used in a phase locked loop for high frequency applications was disclosed by Vaucher et al., "A Family of Low-Power Truly Modular Programmable Dividers in Standard 0.35-μm CMOS Technology," IEEE Journal of Solid-State Circuits, Vol. 35, No. 7, pp. 1039-1045, (July 2000). Referring to FIG. 1, there is an exemplary programmable divider as disclosed by Vaucher et al. The divider includes individual ⅔ cells 100-106. The series connected cells receive clock signal CLK at lead 108 and produce divided clock signal CLK_DIV at lead 110. Each cell responds to a respective mode signal MOD0-MOD3 and a respective program bit B0-B3. The CLK_DIV signal and mode signals MOD0-MOD3 are shown at FIG. 2. Each mode pulse has a width equal to the input clock period of the cell. If a program bit, for example B0 of cell 100, is equal to logic 0, the ⅔ cell 120 divides the input frequency by 2. Alternatively, if the program bit B0 is equal to logic 1, the ⅔ cell 120 divides the input frequency by 3. Timing of cell 100 is determined by the output of AND gate 122, which is a logical AND of mode signal MOD0 and program bit B0.

Referring now to FIG. 3, there is a schematic of a ⅔ cell as disclosed by Vaucher et al. The ⅔ cell includes a prescaler logic block 300 and an end-of-cycle logic block 320. The prescaler logic block 300 includes AND gate 304 and delay flip-flops 306 and 308. The end-of-cycle logic block 320 includes AND gates 332 and 326 and delay flip-flops 330 and 324. All flip-flops are clocked by input frequency $F_{in}$ at lead 302. In operation, the end-of-cycle logic block 320 performs two functions. First, it passes the mode signal at lead 334 to the previous ⅔ cell on lead 322 in response to the true output (Q) from latch 308 and a low-to-high transition of $F_{in}$. Second, it produces an inversion of the signal on lead 322 at lead 303 in response to a high-to-low transition of $F_{in}$.

When the signal on lead 303 is high, AND gate 304 passes the output signal $F_{out}$ at lead 310 to flip-flop 306. Flip-flop 306 latches the input signal on a low-to-high transition of $F_{in}$ at lead 302. A subsequent high-to-low transition of $F_{in}$ latches the true output (Q) of flip-flop 306 in flip-flop 308 to invert the signal $F_{out}$ at the complementary output (/Q) of flip-flop 308. Thus, two transitions of $F_{in}$ at lead 302 produce a single transition of $F_{out}$ at lead 310 when the signal at lead 303 is high and the ⅔ cell divides $F_{in}$ by two. Alternatively, when the signal on lead 303 is low, AND gate 304 does not pass the signal at $F_{out}$ to latch 306 for another cycle, and the ⅔ cell divides $F_{in}$ by three.

Although the ⅔ series cells of Vaucher et al. is very efficient, it does have limitations for certain applications. For example, the output frequency has an asymmetrical duty cycle that gets progressively worse with subsequent frequency divisions. This is evident from FIG. 6 of Vaucher et al. Another limitation is that a straightforward implementation of the ⅔ series cells may have insufficient loop bandwidth or excess phase noise for certain frequency synthesis applications.

BRIEF SUMMARY OF THE INVENTION

According to a first embodiment of the present invention, there is disclosed a method of operating a phase locked loop. The method includes receiving a reference signal and a feedback signal and producing a plurality of phase errors for each cycle of the reference signal in response to the step of comparing.

According to a second embodiment of the present invention, a frequency divider circuit produces an output signal having substantially a 50% duty cycle. The circuit receives an input signal and produces an output signal having a frequency less than a frequency of the input signal. A first frequency divider cell is coupled to the input terminal and receives a first program signal. A second frequency divider cell is coupled between the first frequency divider cell and the output terminal and receives a second program signal. A divide-by-two frequency divider cell receives the output signal and divides it by two.

According to a third embodiment of the present invention, a plurality of frequency divider cells are coupled in series. A first frequency divider cell coupled to an input terminal receives a first program signal. The first frequency divider cell divides the input signal frequency by a first number on a first cycle of the input signal and divides the input signal frequency by a second number on a second cycle of the input signal in response to a first logic state of the first program signal. The first frequency divider cell divides the input signal frequency by the first number on the first and second cycles of the input signal in response to a second logic state of the first program signal.

According to a fourth embodiment of the present invention, a method of dividing a frequency of an input signal is disclosed. An input signal having a plurality of cycles is divided to produce a cycle of an output signal. A first logic state of the cycle has a duration equal to an even number of input signal cycles. A second logic state of the cycle has a duration equal to an odd number of input signal cycles. Other devices, systems, and methods are also disclosed and claimed.

According to a fifth embodiment of the present invention, a method of correcting a phase error in a phase locked loop is disclosed. The method includes receiving a first plurality and a second plurality of phase errors. The first plurality of phase errors is added to produce a sum of phase errors. The sum of phase errors is divided by a number of phase errors in the first plurality to produce an average phase error. The average phase error is subtracted from each phase error in the second plurality of phase errors.

DETAILED DESCRIPTION OF THE INVENTION

Figure 1:
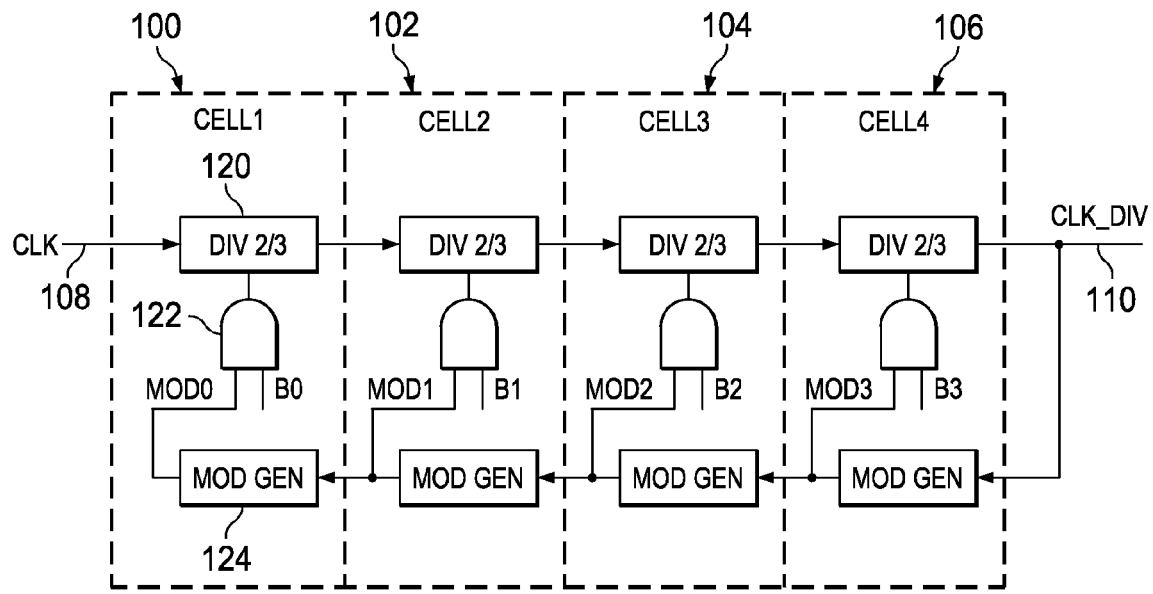
FIG. 1 is a block diagram of frequency divider of the prior art.
Figure 2:
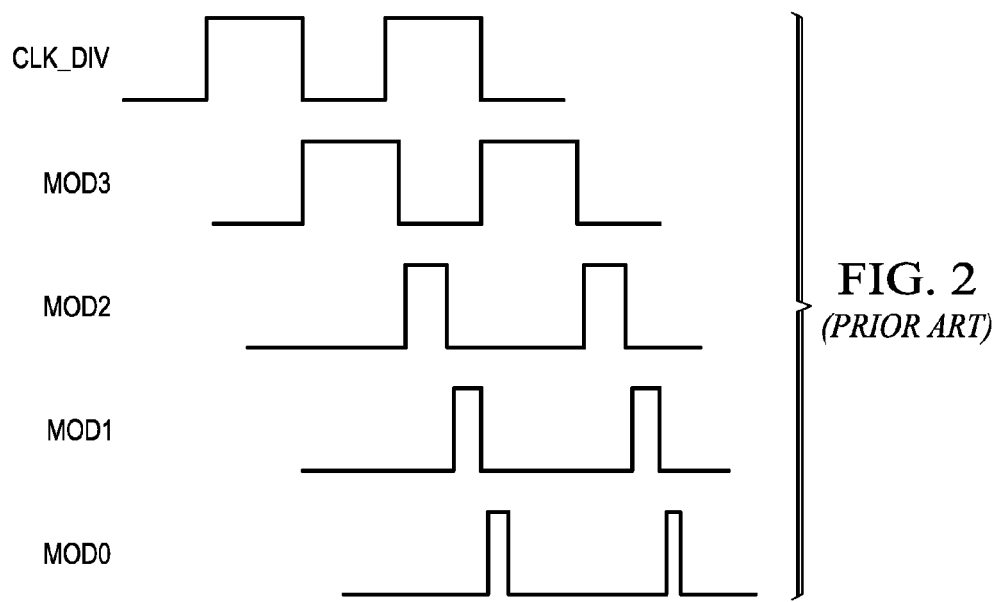
FIG. 2 is a timing diagram of mode pulses of the circuit of FIG. 1.
Figure 3:
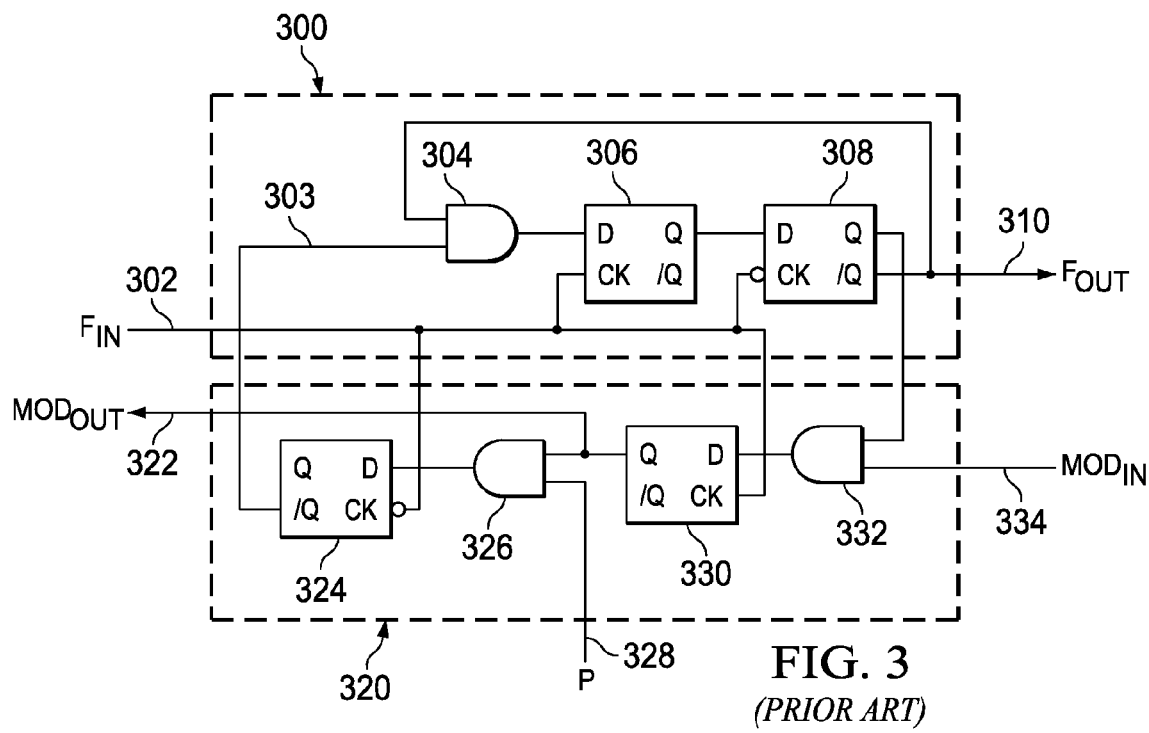
FIG. 3 is a circuit diagram of frequency divider cell of FIG. 1.
Figure 4:
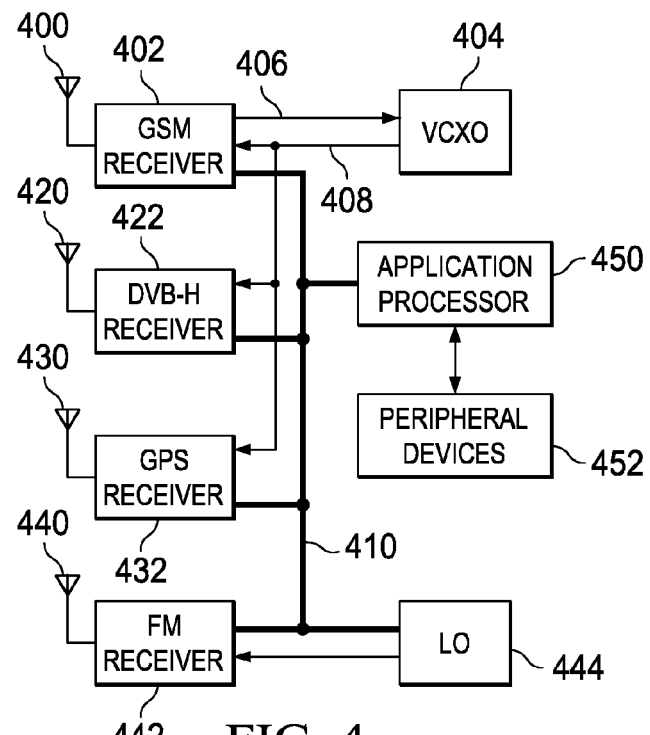
FIG. 4 is a circuit diagram of a multiple service handset of the present invention.

Referring now to FIG. 4, there is a schematic diagram of a multiple service wireless handset of the present invention. The handset includes four separate receivers. Since each receiver operates on a different carrier frequency, each receiver has a separate antenna. For example, GSM receiver 402 is coupled to antenna 400, DVB-H receiver 422 is coupled to antenna 420, GPS receiver 432 is coupled to antenna 430, and FM receiver 442 is coupled to antenna 440. Each receiver is further coupled to application processor 450 by bus 410. Application processor 450 exchanges baseband signals with each receiver, performs appropriate signal processing operations, and sends resulting signals to respective peripheral devices 452. These peripheral devices preferably include a microphone, speaker, liquid crystal display (LCD), and other appropriate devices. Bus 410 includes data, address, and control signal lines to direct operation of each receiver. The multiple service wireless handset also includes voltage controlled crystal oscillator (VCXO) 404. The VCXO 404 produces a reference frequency of preferably 38.4 MHz on lead 408. This reference frequency is supplied to each receiver (402, 422, and 432). Each receiver subsequently produces an appropriate multiplied frequency for down conversion of received signals by respective radio frequency (RF) front ends.

A separate local oscillator 444 is included for FM receiver 442. Local oscillator 444 includes a phase locked loop (PLL). Several unique requirements distinguish local oscillator 444 from oscillator 404. First, it includes a divide-by-M circuit that requires a large programmable range to reproduce an FM carrier frequency corresponding to all possible received frequencies. Second, it requires a very high input frequency to achieve the desired loop gain. Third, the divided FM carrier frequency must have a nearly perfect 50% duty cycle. A 50% duty cycle facilitates generation of inphase and quadrature signals, facilitates frequency doubling, and reduces harmonic generation. In addition to these requirements, the local oscillator 444 must consume minimal power to prolong battery life.

Figure 5:
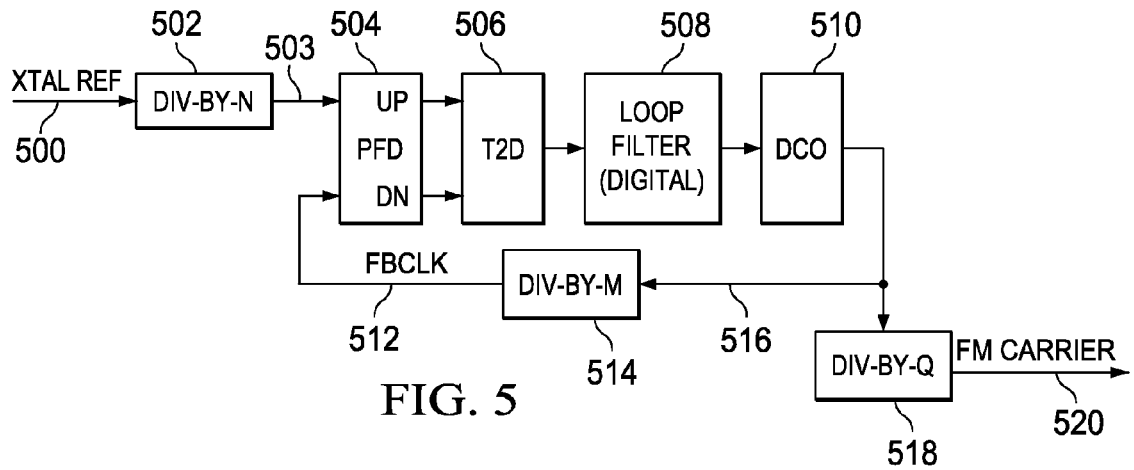
FIG. 5 is a circuit diagram of the local oscillator (LO) of FIG. 4.

Turning now to FIG. 5, there is a circuit diagram of the local oscillator (LO, 444) of FIG. 4. The local oscillator includes three functional sections. First, a divide-by-N circuit 502 receives a crystal oscillator reference frequency on lead 500 and preferably divides it by a small integer such as 8 to produce a reference clock on lead 503. Second, a digital phase locked loop (PLL) includes phase-frequency detector (PFD) 504, a time-to-digital (T2D) circuit 506, a digital loop filter 508, a digitally controlled oscillator (DCO) 510, and a divide-by-M circuit 514. In operation, the phase-frequency detector 504 receives a reference clock on lead 503 and compares it to a feedback clock from divide-by-M circuit 514. The phase-frequency detector 504 produces a phase difference, which is applied to time-to-digital circuit 506. The time-to-digital circuit 506 produces a digital control word. The digital control word is filtered by loop filter 508 and applied to DCO 510. DCO circuit 510 applies the resulting oscillator output frequency on lead 516 to divide-by-M circuit 514 to close the feedback loop. Third, a divide-by-Q circuit 518 also receives the DCO output on lead 516 and produces a desired FM carrier frequency at lead 520. The output frequency of the FM carrier at lead 520 is related to the input frequency XTAL REF at lead 500 by the following equation.

$$F_{520} = \frac{M}{NQ} F_{500} = \frac{M}{Q} F_{503}$$

A very important attribute of the PLL is that it helps reduce the phase noise on the output clock. Any phase noise in the output undergoes a high-pass filtering effect by virtue of the PLL action. Thus, phase noise in the vicinity of the output clock frequency is suppressed. This is an essential requirement in high performance data communication and RF applications. Another important property of a PLL is the loop bandwidth. This is a function of several factors including the sensitivity of the DCO, the bandwidth of the loop filter and the M divide ratio. It can be shown by analysis that in order to get better phase noise suppression, the loop bandwidth must be set to the maximum possible value. However, any attempt to set the loop bandwidth to higher than $\frac{1}{10}$ of $F_{REF}$ will make the loop unstable.

It follows from the above that in order to maximize the loop bandwidth, we must set the reference frequency at lead 503 to its maximum value. However, there is another conflicting requirement. That is, in many applications the PLL output frequency must be tunable over a band of frequencies. One example of this is a FM receiver where the output frequency has to be tuned over a 88-108 MHz band in 100 KHz steps in North America and over a 76-108 MHz band in 50 KHz steps worldwide. This is typically done by changing the M divider ratio of FIG. 5. The divide ratio can normally changed in steps of 1. Thus, the frequency resolution or minimum frequency step size that can be achieved is equal to the reference frequency at lead 503 divided by Q. The only two ways to achieve a small step size is either to increase Q or decrease $F_{REF}$. An increase in Q, however, increases the DCO frequency for a given output frequency. This in turn increases power dissipation and is also limited by technology.

There are several design considerations in the selection of integer divisors N, M, and Q. First, a high frequency from DCO 510 is desirable to increase the loop bandwidth of the digital phase locked loop. But the present characteristics of deep submicron CMOS technology limit the maximum operating frequency to about 3 GHz. Second, the FM carrier frequency must range from 76 MHz to 108 MHz in 50 KHz steps. The required range of M, therefore, is from 1520 to 2016 in steps of 1 to produce the required 50 KHz steps over the FM carrier range. This corresponds to a phase-frequency detector 504 output frequency of 1.49 MHz to 1.97 MHz. The loop bandwidth of the digital phase locked loop, however, must be less than 10% of the phase-frequency detector 504 output frequency to prevent oscillation. This implies the loop bandwidth is less than 150 KHz. This loop bandwidth, however, is inadequate to meet the phase noise requirement of the digital phase locked loop.

Given the foregoing design considerations, the divide-by-M circuit 514 of the present invention increases the loop bandwidth of the digital phase locked loop by choosing the range of M from 760 to 1008 is steps of 0.5. Moreover, a more conservative maximum frequency of 2.4 GHz for the digital controlled oscillator 510 is selected. This produces a frequency range of 2.38 MHz to 3.16 MHz from the phase-frequency detector 504 and a maximum loop bandwidth of 238 KHz.

Figure 6A:
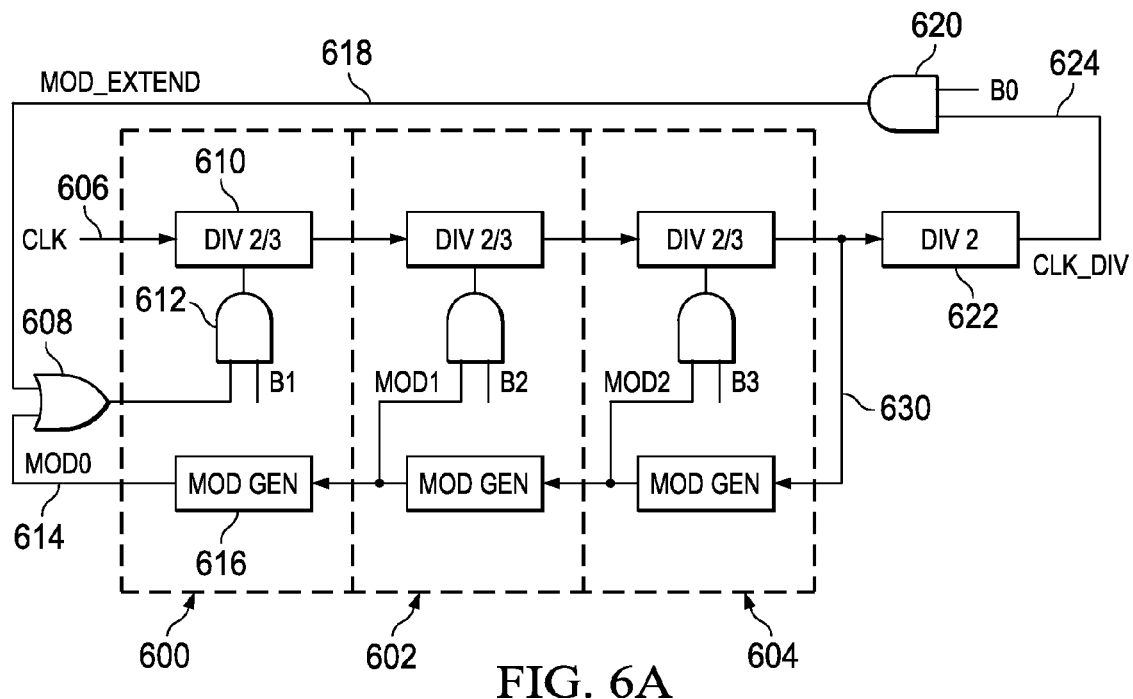
FIG. 6A is a circuit diagram of the divide-by-M circuit of FIG. 5.
Figure 6B:
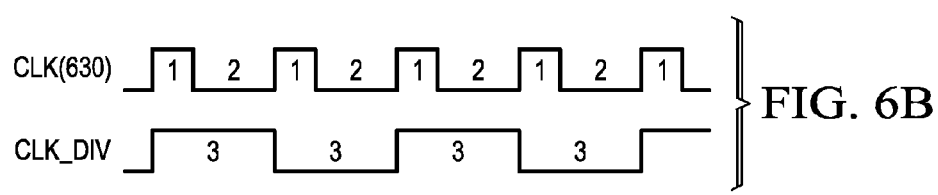
FIG. 6B is a timing diagram of waveforms from the circuit of FIG. 6A.

Referring now to FIG. 6A, there is an exemplary four-stage divide-by-M circuit 514. Other stages are omitted for clarity. The divide-by-M circuit includes three ⅔ cells 600-604 and a fixed divide-by-2 cell 622. Divide-by-2 cell 622 performs a final divide-by-2 frequency division of the signal on lead 630 and restores the 50% duty cycle to the output signal on lead 624. This operation of divide-by-2 cell 622 is illustrated with reference to FIG. 6B. The exemplary clock signal at lead 630 CLK (630) has a 33% duty cycle after previous ⅔ cell frequency divisions. CLK (630) is high for one time unit and low for two time units. The divide-by-2 cell 622 changes the state of CLK_DIV at lead 624 at each low-to-high transition of CLK (630). These low-to-high transitions are evenly spaced in time for any duty cycle. Thus, divide-by-2 cell 622 advantageously restores a 50% duty cycle to CLK-DIV.

Referring back to FIG. 6A, each ⅔ cell, for example cell 600, includes a divide-by-⅔ section 610, a mode generation section 616, and an AND gate 612. Each ⅔ cell functions in substantially the same manner as previously discussed with the exception of cell 600. Cell 600 receives the output of OR gate 608 rather than a simple mode signal. One input of OR gate 608 receives mode signal MOD0 on lead 614. The other input of OR gate 608 receives the output of AND gate 620 at lead 618, which is the logical AND of program bit B0 and divide-by-M output CLK_DIV on lead 624. In operation, when program bit B0=0, the divide-by-M circuit divides the frequency of input CLK at lead 606 by 16 to 32 in steps of two as program bits B1 through B3 vary from all zero to all one logic states. When B0=1, however, an additional mode signal MOD_EXTEND is generated on lead 618 when CLK_DIV on lead 624 is high. This produces an additional mode signal once every cycle of CLK_DIV and suppresses one CLK cycle. When program bit B0=0, therefore, the divide-by-M circuit output signal CLK_DIV is an even division of input signal CLK. Alternatively, when program bit B0=1, the divide-by-M circuit output signal CLK_DIV is an odd division of input signal CLK.

Figure 9A:
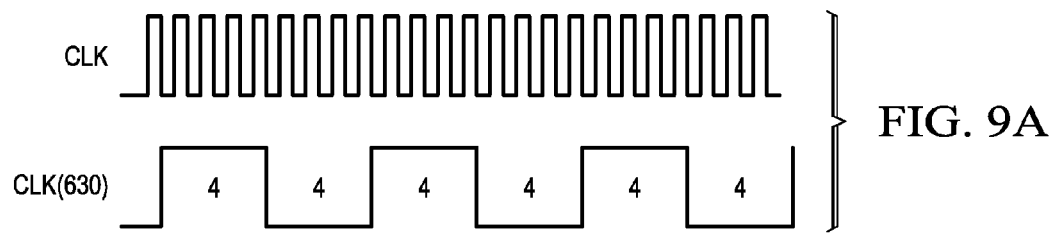
FIGS. 9A through 9D are timing diagrams of output waveforms from the divide-by-M circuit of FIG. 5.
Figure 9B:
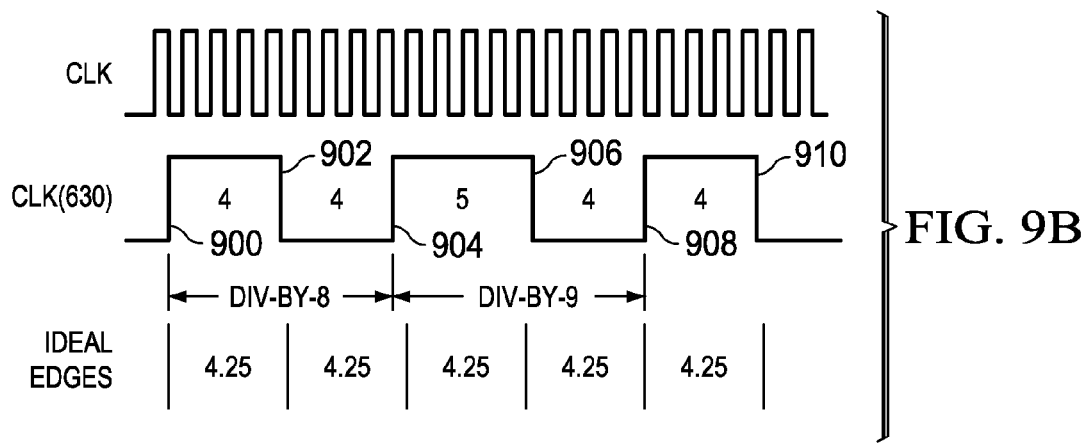
Figure 9C:
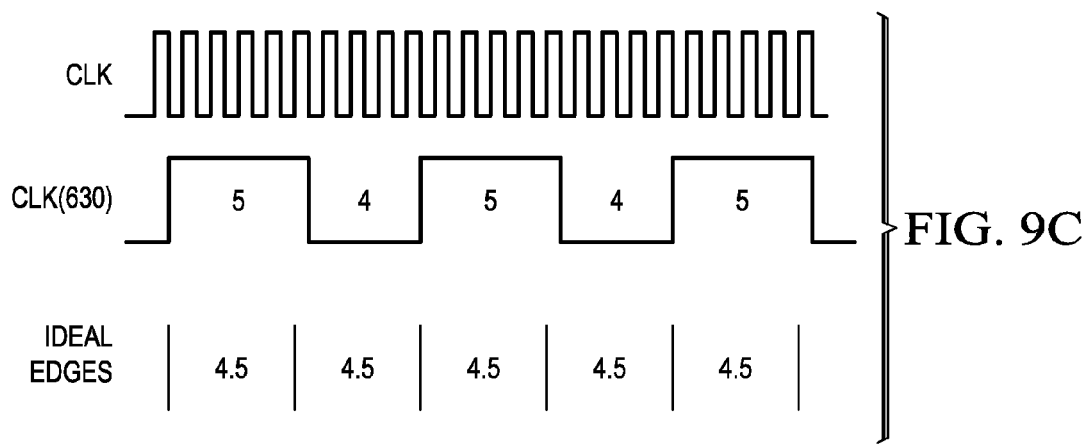
Figure 9D:
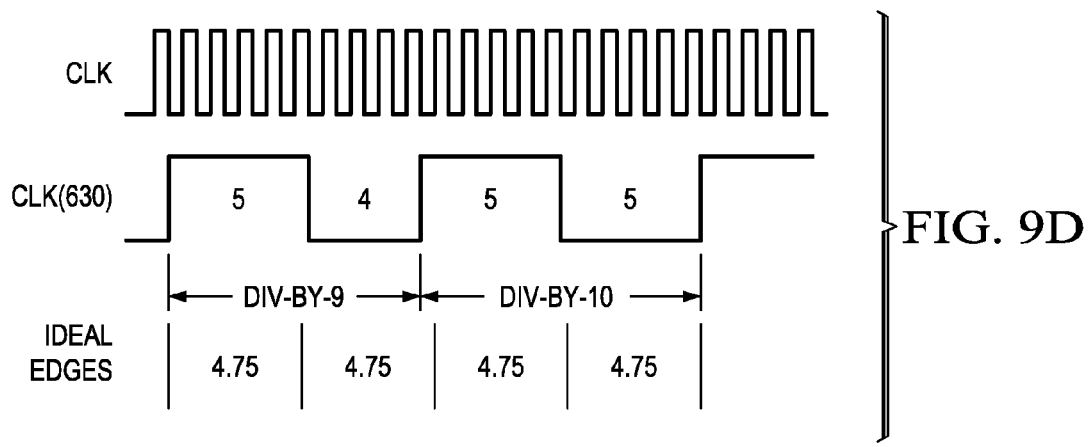

FIGS. 9A-9D show how the divide-by-M circuit can be used to generate division ratios of 8, 8.5, 9, and 9.5. Turning now to FIG. 9A, there is a timing diagram showing the signal at lead 630 CLK (630) of the divide-by-M circuit of FIG. 6A when programmed for divide-by-8. The number by each half cycle of CLK (630) indicates the corresponding number of cycles of CLK at lead 606. In this case each of cells 600-604 successively divide by 2 to produce one cycle on lead 630 for every 8 cycles of CLK. FIG. 9B is a timing diagram of CLK (630) of the divide-by-M circuit of FIG. 6A when programmed alternately to divide-by-8 and divide-by-9. This is effectively an integer divide-by-8.5 of input signal CLK. FIG. 9C is a timing diagram of the divide-by-M circuit when programmed to divide-by-9. Finally, FIG. 9D illustrates a timing diagram of the divide-by-M circuit when programmed alternately to divide-by-9 and divide-by-10. This is effectively a divide-by-9.5 operation. This concept can be extended to realize large divide ratios in steps of 0.5.

The foregoing discussion of the divide-by-M circuit of FIG. 6A illustrates a nearly perfect 50% duty cycle of CLK_DIV at lead 624. Each half cycle of CLK_DIV will differ by no more than one cycle of input signal CLK at lead 606. In practice, this is a very small difference due to the relatively larger frequency division. However, any duty cycle deviation from 50% output frequency produces noise spikes or spurs at the output of phase-frequency detector 504 (FIG. 5). Moreover, the phase error is accumulated on both rising and falling clock edges.

For a given M divide ratio, the effective value of the reference frequency at lead 503 can be further doubled by using dual edge phase-frequency detection. Referring back to FIG. 5, the phase-frequency detector (PFD) of the present invention compares the phase of FBCLK at lead 512 with the reference clock at lead 503 on both the rising and falling edges. Thus, by combining a divide-by M step size of 0.5 with a dual edge PFD 504, we can achieve a fourfold increase in the effective reference frequency at lead 503 as well as a fourfold increase in the loop bandwidth.

Although fractional division achieves the correct frequency on an average, the instantaneous positions of the rising edges and falling edges are no longer equally spaced. Furthermore, with dual edge phase-frequency detection, any deviation of from a 50% duty cycle results in an additional error in the spacing of the edges. Referring back to FIG. 9B, there is a phase offset between the ideal edges and the actual edges. This error pattern repeats once every four edges or two cycles. For example, the first four edges are 900, 902, 904, and 906. Edges 908 and 910 are the first two edges on the next set of four edges and correspond to edges 900 and 902, respectively. Within each set of four edges, there is a phase offset between the first edge and the other three edges. That is, the phase offset between edge 900 and edge 902 is different from the phase offset between edge 900 and edge 904 and is also different from the phase offset between edge 900 and edge 906. The values of these phase offsets, however, are the same for all corresponding edges of each set of edges. If feedback signal FBCLK at lead 512 with these phase offsets is applied to the PFD 504 without correction, the output of the PFD produces a phase error pattern which repeats once every four edges. This phase error propagates to the DCO 510 through the loop filter 508 and modulates the DCO frequency, resulting in unacceptable spurious tones at the DCO output.

Figure 10A:
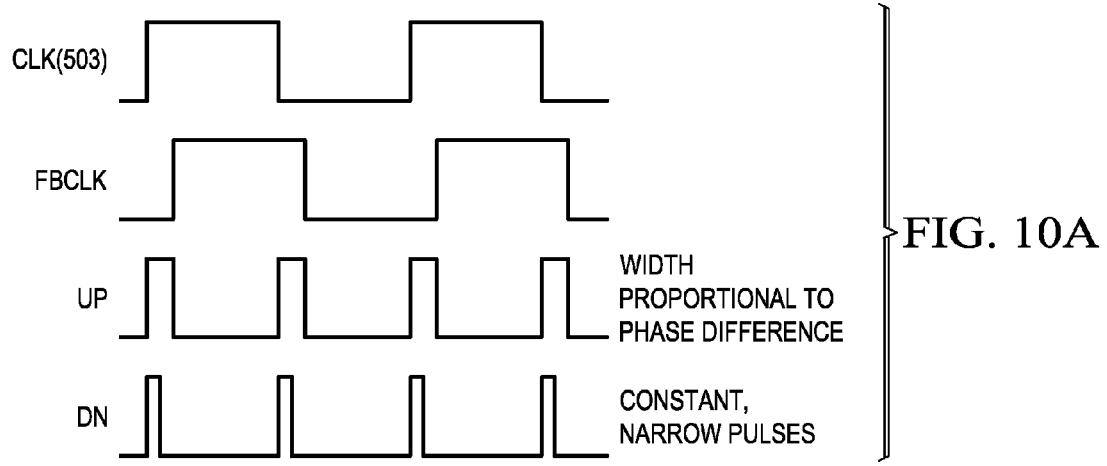
FIG. 10A is a timing diagram of output waveforms from the phase-frequency detector (PFD) of FIG. 5.

Referring back to FIG. 5, PFD 504 compares the phase of the reference clock at lead 503 with FBCLK at lead 512. The PFD produces exemplary up (UP) and down (DN) signals shown at FIG. 10A for the case where feedback clock FBCLK lags the reference clock CLK (503). The UP pulse is proportional to the phase difference between CLK (503) and FBCLK. The DN pulse is relatively constant and narrow by comparison. Alternatively, when FBCLK leads CLK (503), the DN pulse is proportional to the phase difference between CLK (503) and FBCLK and the UP pulse is relatively constant and narrow by comparison. A significant advantage of the present invention for either case results from the PFD comparison of CLK (503) and FBCLK for both edges of each cycle. This comparison produces two phase comparisons for each clock cycle. Moreover, since the phase error pattern from fractional division repeats every set of four contiguous edges will be different. The time to digital (T2D) circuit 506 receives the UP and DN pulses from the PFD 504 and compares them to determine which has the greater width. As shown in FIG. 10A, FBCLK lags CLK (503), so the UP pulse is wider than the DN pulse. The T2D circuit 506, therefore, produces a digital word corresponding to each comparison of the UP pulse and essentially ignores the DN pulse. This digital word is preferably 4 to 6 bits and is proportional to the phase lag or lead time of each comparison.

Figure 10B:
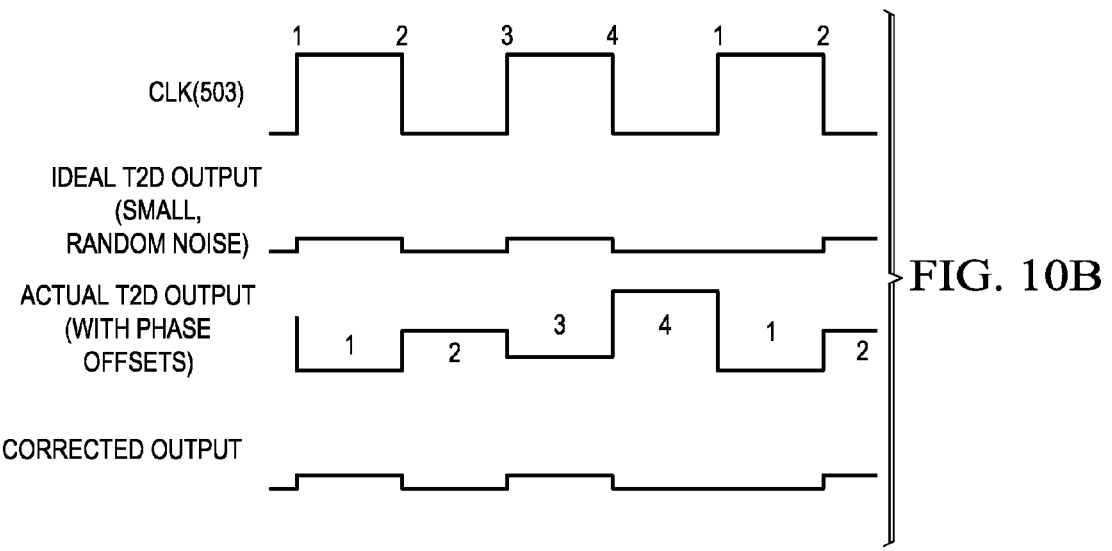
FIG. 10B is a timing diagram of output waveforms from the time-to-digital (T2D) circuit of FIG. 5.

Referring now to FIG. 10B, there is an exemplary timing diagram of the T2D output corresponding to phase comparisons of edges 1-4 of CLK (503) with respective FBCLK edges. Even with a perfect frequency divider, the T2D output will have slight variations as shown in the second waveform. This is due to the slight variations of the digital PLL at phase lock. Each digital word of the ideal T2D output, therefore, will typically differ by only a least significant bit from one phase comparison to the next. The actual T2D output is shown below the ideal waveform for the purpose of illustration. The height of each pulse 1-4 of the T2D output represents the value of the digital word for phase comparison. By way of comparison with the ideal T2D output, the actual T2D output reveals significantly larger phase differences for each edge, resulting from phase offsets due to fractional division as well as a non-ideal duty cycle from the frequency divider.

Figure 7:
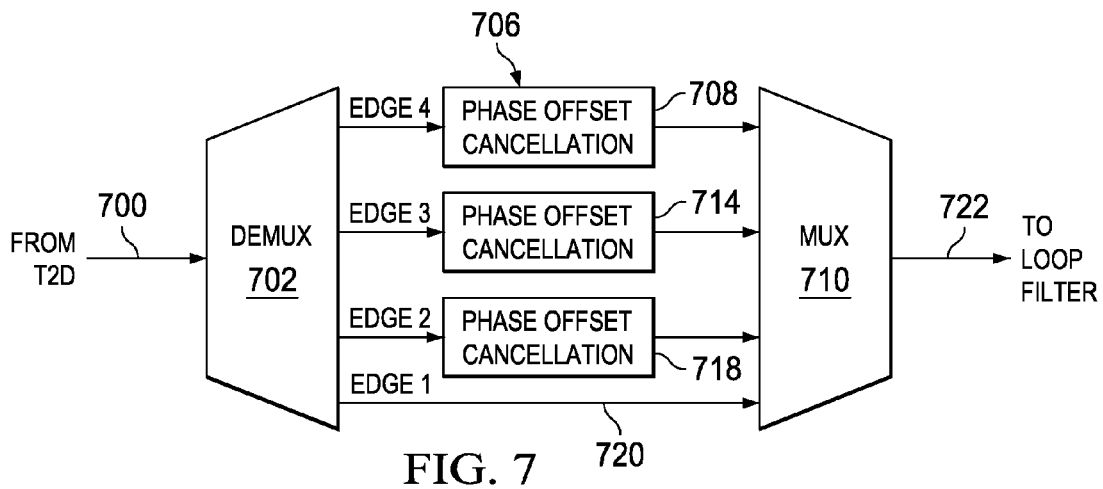
FIG. 7 is a circuit diagram of a phase correction circuit included in the loop filter of the circuit of FIG. 5.

Referring now to FIGS. 5 and 7, there is a phase correction circuit included in the loop filter 508. The phase correction must correct for large phase comparison differences from the actual T2D output as shown at FIG. 10B and produce the corrected output as shown. The phase correction circuit includes a demultiplex circuit 702 that receives a phase error signal from the T2D circuit 506. The demultiplex circuit 702 includes a counter that keeps track of each digital word from each corresponding phase comparison. The demultiplex circuit 702 applies the digital word corresponding to edge 1 at lead 720 directly to multiplexer 710. Moreover, the demultiplex circuit 702 applies every fourth digital word corresponding to each edge 1 comparison directly to multiplexer 710. Digital words corresponding to edge 2-4 phase errors are applied to phase offset cancellation circuits 718, 714, and 708, respectively. For example, phase offset cancellation circuit 718 receives a sequence of digital words corresponding to edge 2 phase comparisons. Phase offset cancellation circuit 714 receives a sequence of digital words corresponding to edge 3 phase comparisons. Likewise, phase offset cancellation circuit 708 receives a sequence of digital words corresponding to edge 4 phase comparisons. The output of each phase cancellation circuit is then applied to multiplexer 710. Multiplexer 710 reassembles the corrected phase signals corresponding to each edge and sends them to the loop filter on lead 722.

Figure 8:
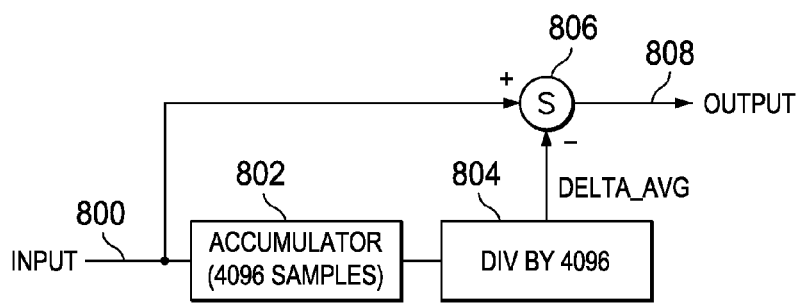
FIG. 8 is a schematic diagram of a phase offset cancellation circuit of the phase correction circuit of FIG. 7.

Turning now to FIG. 8, there is a schematic diagram of a phase offset cancellation circuit of the phase correction circuit of FIG. 7. Each phase offset cancellation circuit 708-718 is substantially the same. The phase offset cancellation circuit receives a sequence of digital words corresponding to a phase comparison one of edges 2-4. Accumulator 802 collects a large number of these phase errors. In a preferred embodiment of the present invention, the accumulator collects 4096 samples. Once the 4096 samples are collected, the accumulator 802 resets and begins to accumulate another 4096 samples. Circuit 804 divides the accumulated result by 4096 to produce an average (Delta_Avg) of the variable component of the phase error of a respective transition edge. Adder 806 then subtracts Delta_Avg from each digital word in the sequence for the respective edge until another 4096 samples are accumulated. Adder 806 produces a filtered phase error on lead 808.

The present invention advantageously produces a corrected output as shown at FIG. 10B which is similar to the ideal T2D output. This corrected output from phase correction circuit of FIG. 7 is applied to loop filter 508. Integer division of the divide-by-M circuit 514 in combination with dual edge comparison by PFD circuit 504 and phase error correction provide a fourfold increase in loop bandwidth of the digital PLL. Moreover, the present invention is simple and relatively inexpensive. Integer division of the divide-by-M circuit 514 is performed by alternating the frequency divisor on adjacent cycles. PFD 504 compares each edge of the resulting FBCLK at lead 512 to the reference clock CLK (503). The phase error from integer division is corrected by the phase correction circuit of FIGS. 7 and 8. Minimal computation is required. Two integer additions are required for 3 of the 4 edges for the accumulator and phase correction. An integer divide is required for 3 of the 4 edges every 8192 cycles to calculate Delta_Avg.

Still further, while numerous examples have thus been provided, one skilled in the art should recognize that various modifications, substitutions, or alterations may be made to the described embodiments while still falling with the inventive scope as defined by the following claims.

What is claimed is:

1. A phase locked loop circuit, comprising:
   a phase detector circuit coupled to receive a reference signal and a feedback signal, the phase detector circuit producing at least two phase error signals during each cycle of the feedback signal;
   a time to digital circuit coupled to receive the at least two phase error signals during each cycle of the feedback, the time to digital signal producing a plurality of digital words in response to each respective phase error signal; and
   a phase correction circuit coupled to receive the plurality of digital words, the phase correction circuit producing an average digital word from a first group of the digital words, the phase correction circuit subtracting the average digital word from a second group of the digital words, thereby producing a plurality of corrected digital words.

2. A phase locked loop as in claim 1, comprising:
   a digitally controlled oscillator coupled to receive the plurality of corrected digital words, the digitally controlled oscillator producing an oscillating output signal in response to the corrected digital words; and
   a frequency divider coupled to receive the oscillator output signal and produce the feedback signal, the frequency divider having a plurality of frequency divider cells coupled in series, wherein a first frequency divider cell of the plurality of frequency divider cells is coupled to receive the oscillator output signal and a first program signal, the first frequency divider cell dividing the oscillator output signal by a first number on odd cycles of the oscillator output signal and by a second number on even cycles of the oscillator output signal in response to a first logic state of the first program signal.

3. A phase locked loop as in claim 2, wherein the first frequency divider cell divides the oscillator output signal by the first number on the odd and the even cycles of the oscillator output signal in response to a second logic state of the first program signal.

4. A method of correcting a phase error in a phase locked loop, comprising:
   receiving a first plurality and a second plurality of phase error signals;
   adding the first plurality of phase error signals to produce a sum of phase errors;
   dividing the sum of phase errors by a number of phase errors in the first plurality to produce an average phase error; and
   subtracting the average phase error from each phase error in the second plurality, said steps of receiving, adding, dividing and subtracting being performed in electronic circuitry.

5. A method as in claim 4, wherein each of the first plurality and the second plurality of phase errors are digital words having a same number of bits.

6. A method as in claim 4, wherein the first plurality of phase errors is produced by comparing a first plurality of reference clock edges to a first plurality of feedback clock edges.

7. A method as in claim 6, wherein the first plurality of feedback clock edges is from alternate cycles of the feedback clock.

8. A method as in claim 6, wherein each feedback clock edge of the first plurality of feedback clock edges is separated by at least two other edges of the feedback clock.

9. A method as in claim 4, wherein each phase error of the first plurality of phase errors is produced by a fractional frequency divider.

10. A method as in claim 9, wherein the fractional frequency divider produces odd cycles of the feedback clock each having a first duration and produces even cycles of the feedback clock each having a second duration different from the first duration.

11. A multiple service wireless handset, comprising:
    a first wireless receiver coupled to a first oscillator;
    a second wireless receiver coupled to a second oscillator, the second oscillator comprising:
    a phase detector circuit coupled to receive a reference signal and a feedback signal, the phase detector circuit producing at least two phase error signals during each cycle of the feedback signal;
    a time to digital circuit coupled to receive the at least two phase error signals during each cycle of the feedback, the time to digital signal producing a plurality of digital words in response to each respective phase error signal;
    a phase correction circuit coupled to receive the plurality of digital words, the phase correction circuit producing an average digital word from a first group of the digital words, the phase correction circuit subtracting the average digital word from a second group of the digital words, thereby producing a plurality of corrected digital words; and
    a digitally controlled oscillator coupled to receive the plurality of corrected digital words, the digitally controlled oscillator producing an oscillating output signal in response to the corrected digital words.

12. A multiple service wireless handset as in claim 11, wherein the second oscillator comprises a frequency divider coupled to receive the oscillator output signal and produce the feedback signal, the frequency divider having a plurality of frequency divider cells coupled in series, wherein a first frequency divider cell of the plurality of frequency divider cells is coupled to receive the oscillator output signal and a first program signal, the first frequency divider cell dividing the oscillator output signal by a first number on odd cycles of the oscillator output signal and by a second number on even cycles of the oscillator output signal in response to a first logic state of the first program signal.

13. A multiple service wireless handset as in claim 12, wherein the first frequency divider cell divides the oscillator output signal by the first number on the odd and the even cycles of the oscillator output signal in response to a second logic state of the first program signal.

* * * * *